(12) United States Patent
Chen et al.

(10) Patent No.: US 7,339,403 B2
(45) Date of Patent: Mar. 4, 2008

(54) CLOCK ERROR DETECTION CIRCUITS, METHODS, AND SYSTEMS

(75) Inventors: Suwei Chen, Hillsboro, OR (US); Derek M. Conrow, Tigard, OR (US); Aaron K. Martin, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 82 days.

(21) Appl. No.: 11/477,833

(22) Filed: Jun. 29, 2006

(65) Prior Publication Data

US 2008/0001637 A1    Jan. 3, 2008

(51) Int. Cl.
*H03K 5/22* (2006.01)

(52) U.S. Cl. .............. 327/26; 317/18; 317/19; 317/20; 317/21; 326/95; 326/96; 326/97; 326/98

(58) Field of Classification Search ...... None
See application file for complete search history.

(56) References Cited

U.S. PATENT DOCUMENTS

| | | | |
|---|---|---|---|
| 5,650,971 A * | 7/1997 | Longway et al. ........... 365/207 |
| 6,366,113 B1 * | 4/2002 | Song ........................ 326/24 |
| 6,424,181 B1 * | 7/2002 | Pogrebnoy ................ 327/55 |
| 6,833,737 B2 * | 12/2004 | Aipperspach ............. 327/55 |
| 6,894,549 B2 * | 5/2005 | Eliason ................... 327/217 |
| 7,233,172 B2 * | 6/2007 | Kanamori et al. ......... 327/55 |
| 2003/0210078 A1 * | 11/2003 | Wijetunga et al. ......... 327/52 |
| 2004/0095179 A1 * | 5/2004 | Eliason ................... 327/217 |
| 2007/0057698 A1 * | 3/2007 | Verbauwhede et al. .... 327/52 |

OTHER PUBLICATIONS

Lee, Thomas H., et al., "A 2.5 V CMOS Delay-Locked Loop for an 18 Mbit, 500 Megabyte/s DRAM", IEEE Journal of solid-state circuits, vol. 29, No. 12,(Dec. 1994),6pgs.

Yoo, C. , et al., "Open-loop full-digital duty cycle correction circuit", Electronics letters, vol. 41, No. 11,(May 26, 2005),2pgs.

* cited by examiner

*Primary Examiner*—Tuan T. Lam
*Assistant Examiner*—Hiep Nguyen
(74) *Attorney, Agent, or Firm*—Dana B. Lemoine; Lemoine Patent Services, PLLC

(57) ABSTRACT

Clock error detections circuits can detect clock duty cycle error and/or quadrature phase error. During an evaluation phase, capacitors are charged. During an evaluation phase, the capacitors are unequally discharged based on the error. A positive feedback mechanism latches the result.

20 Claims, 9 Drawing Sheets

CLOCK ERROR DETECTION CIRCUITS, METHODS, AND SYSTEMS

FIELD

The present invention relates generally to clock circuits, and more specifically to the detection of errors in clock signals.

BACKGROUND

Integrated circuits such as processors, memory devices, memory controllers, input/output (I/O) controllers, and the like typically communicate with each other using digital data signals and clock signals. Some systems rely on clock signals having 50% duty cycles. When the duty cycle of these clock signals deviates much from 50%, circuits within the system may not operate as intended. Further, some systems rely on multiple clock signals having defined phase relationships. When the phase relationships deviate from the defined relationships, circuits within the system may not operate as intended. Some prior art integrated circuits include duty cycle detection circuits to detect whether a clock signal has a 50% duty cycle. Information from the duty cycle detection circuits can be utilized in a feedback loop to correct the duty cycle of the clock signal.

FIG. 1 shows a prior art duty cycle detection circuit. Circuit 100 receives a differential clock signal (CLK, $\overline{CLK}$), and capacitors 102 and 104 operate as integrators to detect a duty cycle difference between CLK and $\overline{CLK}$. The charge stored on capacitor 102 and capacitor 104 is a function of the duty cycle of the differential clock signal (CLK, $\overline{CLK}$). Circuit 100 develops a differential voltage on nodes 106 and 108, and that differential voltage is an indication of the amount of duty cycle error in the differential clock signal.

In the example circuit 100, capacitors 102 and 104 operate as integrators to detect the duty cycle error, and also operate as charged storage devices to hold the duty cycle error information. If power is removed from circuit 100, the duty cycle error information on capacitors 102 and 104 may be lost, and a finite amount of time may be necessary upon the reapplication of power to reach a steady state duty cycle error value. Further discussion of circuit 100 may be found in "T. H. Lee et al., A 2.5V CMOS DLL for an 18 Mb 500 Mbps DRAM, JSSC, V.29 No. 12, 12/1994."

In addition to analog duty cycle detection circuits such as circuit 100, digital duty cycle detection circuits exist. Rather than integrate duty cycle errors on analog capacitors, digital duty cycle detectors typically latch the values of clock signals at various times, make comparisons, and provide an indication of duty cycle error. Digital implementations typically suffer from a lack of precision due in part to the finite delay granularity of delay lines and set-up and hold requirements of digital storage elements. One digital duty cycle detection circuit is described in "C. Yoo et al., Open-Loop Full-Digital Duty Cycle Correction Circuit, Elec Ltrs, V.41 No. 11 5/2005."

DESCRIPTION OF EMBODIMENTS

Figure 1:
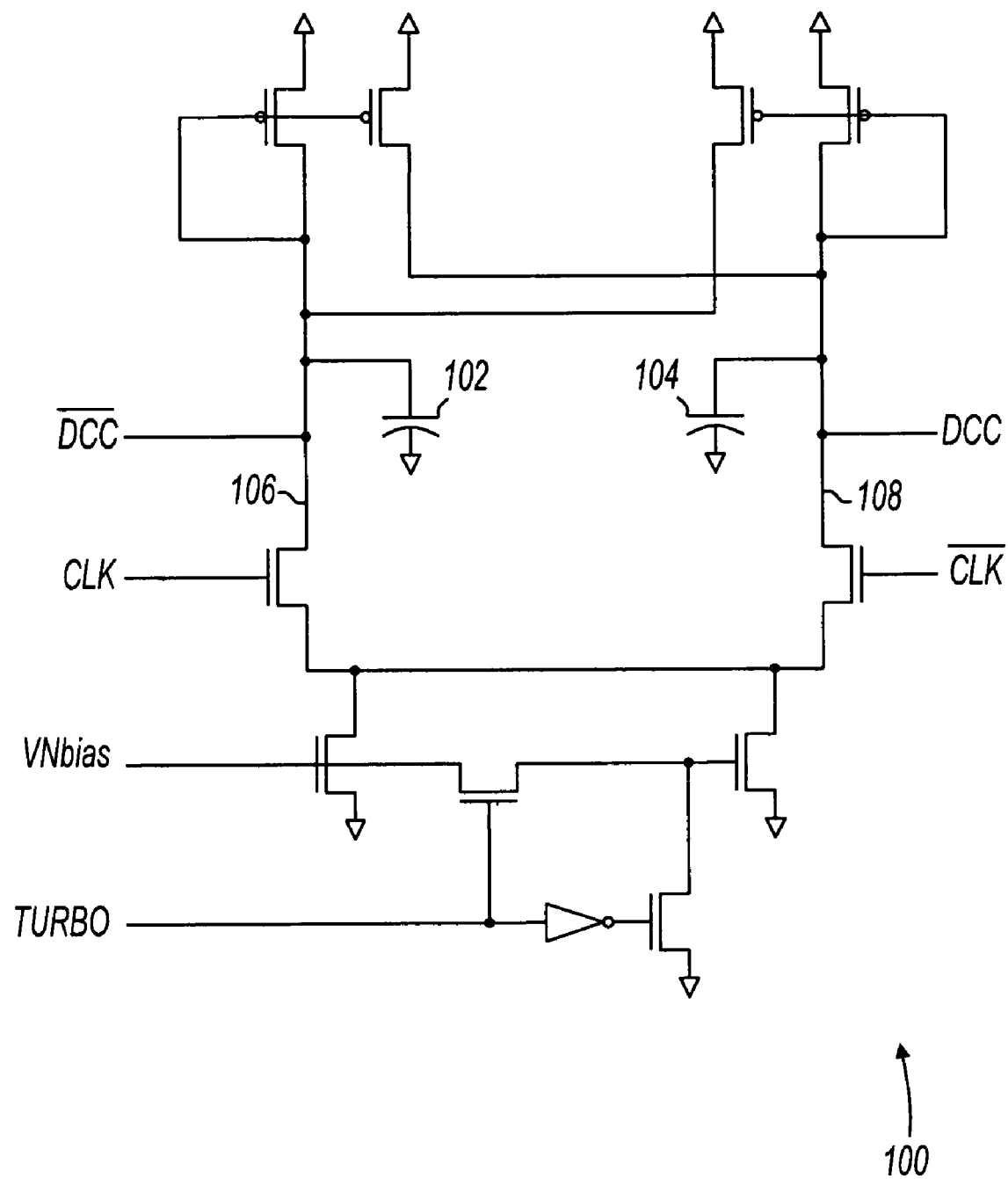
FIG. 1 shows a prior art duty cycle detection circuit.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 2:
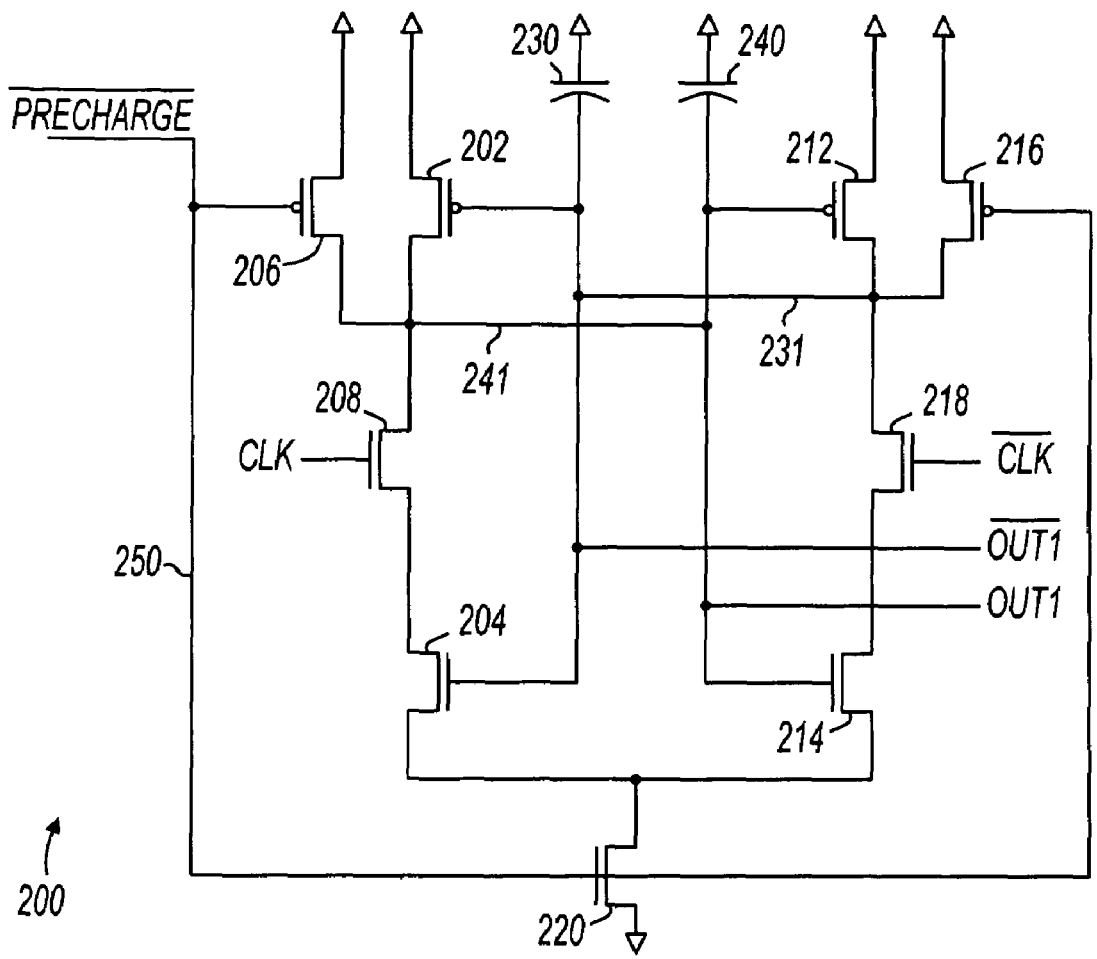
FIGS. 2 and 3 show duty cycle detection circuits in accordance with various embodiments of the present invention.

FIG. 2 shows a duty cycle detection circuit in accordance with various embodiments of the present invention. Circuit 200 includes transistors 202, 204, 206, 208, 212, 214, 216, 218, and 220. Circuit 200 also includes capacitors 230 and 240. The transistors in FIG. 2 are shown as field effect transistors, and specifically as metal oxide semiconductor field effect transistors (MOSFETs). Transistors 202, 206, 212, and 216 are shown as a P-type MOSFET, and the remaining transistors are shown as N-type MOSFETs. Other types of switching or amplifying elements may be utilized for the various transistors of circuit 200 without departing from the scope of the present invention. For example, the transistors of circuit 200 may be MOSFETs, junction field effect transistors (JFETs), metal semiconductor field effect transistors (MESFETs), or any device capable of performing as described herein.

Transistors 202 and 204 form a first inverter when transistor 208 is on. Likewise, transistors 212 and 214 form a second inverter when transistor 218 is on. The first and second inverters are cross-coupled. As used herein, the term "cross-coupled" corresponds to the output of the first inverter being coupled to the input of the second inverter, and the output of the second inverter being coupled to the input of the first inverter. Further, capacitors 230 and 240 are coupled to the cross-coupled pair of inverters. For example, capacitor 230 is coupled to the input of the inverter formed by transistors 202 and 204 and is also coupled to the output of the inverter formed by transistors 212 and 214. Likewise, capacitor 240 is coupled to the input of the inverter formed by transistors 212 and 214, and is also coupled to the output of the inverter formed by transistors 202 and 204.

Circuit 200 operates in two phases: a pre-charge phase, and an evaluation phase. When the $\overline{\text{PRECHARGE}}$ signal is asserted low, circuit 200 is in a pre-charge phase, and when the $\overline{\text{PRECHARGE}}$ signal is de-asserted high, circuit 200 is in an evaluation phase. At the end of the evaluation phase, circuit 200 provides a digital indication as to whether the clock duty cycle is above or below 50%.

Transistors 206 and 216 form a pre-charge circuit driven by the $\overline{\text{PRECHARGE}}$ signal on node 250. When the $\overline{\text{PRECHARGE}}$ signal is asserted low, circuit 200 enters a pre-charge phase, and capacitors 230 and 240 are pre-charged such that both terminals of the capacitors have substantially the same voltage. Further, during the pre-charge phase, transistor 220 is turned off to stop current flow in the circuit. When the $\overline{\text{PRECHARGE}}$ signal is de-asserted high, transistors 206 and 216 are turned off, and transistor 220 is turned on. This marks the beginning of an evaluation phase. At the beginning of the evaluation phase, nodes 231 and 241 have voltage values substantially equal to the upper power supply voltage. Accordingly, at the beginning of the evaluation phase, transistors 202 and 212 are off, and transistors 204 and 214 are on.

During the evaluation phase, a differential clock signal (CLK, $\overline{\text{CLK}}$) is applied to the gate nodes of transistors 208 and 218. Transistor 208 forms a first evaluation circuit responsive to a first polarity of the clock signal. When transistor 208 is on, charge from capacitor 240 may travel as current through transistors 208, 204, and 220. Similarly, transistor 218 forms a second evaluation circuit and when on, charge from capacitor 230 may travel as a current through transistors 218, 214, and 220.

In some embodiments, capacitor values for capacitors 230 and 240 are chosen such that it takes multiple cycles of the differential clock signal to bleed enough charge from the capacitors so as to allow the cross-coupled inverters to operate. For example, over many clock periods, one of the evaluation circuits will have been on for a greater amount of time based on the duty cycle of the clock signal. In response to this "duty cycle error," one of capacitors 230 and 240 will discharge faster than the other during the evaluation phase.

For the sake of discussion, assume capacitor 230 discharges more quickly in response to evaluation transistor 218 being on for a greater time than transistor 208. As the voltage on node 231 drops below the threshold voltage for transistor 202, transistor 202 begins to turn on, thereby pulling node 241 up towards the upper power supply. As this occurs, the output of the inverter formed by transistors 202 and 204 approaches the upper power supply voltage, and the output of the inverter formed by transistors 212 and 214 continues to drop towards the lower power supply. In this positive feedback scenario, the cross-coupled inverters latch an output value on nodes 231 and 241 to signify whether the duty cycle of the differential clock is above or below 50%.

Figure 3:
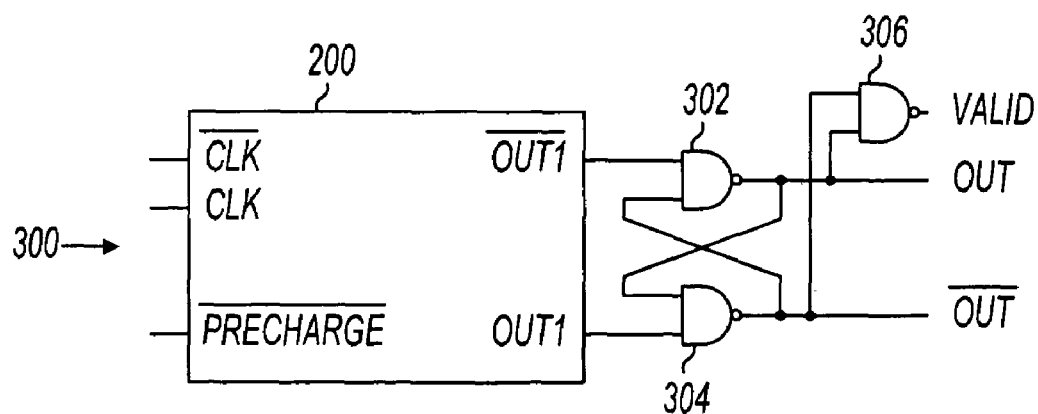

FIG. 3 shows a duty cycle detection circuit and an output latch. Circuit 300 includes duty cycle detection circuit 200, described above with reference to FIG. 2. Circuit 300 also includes an R-S latch made of gates 302 and 304. The R-S latch allows the output signals of duty cycle detection circuit 200 to approach the positive power supply voltage during the pre-charge phase, while only changing the output of the R-S latch during the evaluation phase. Gate 306 is included to provide a VALID signal to signify that the R-S latch output is valid.

Figure 4:
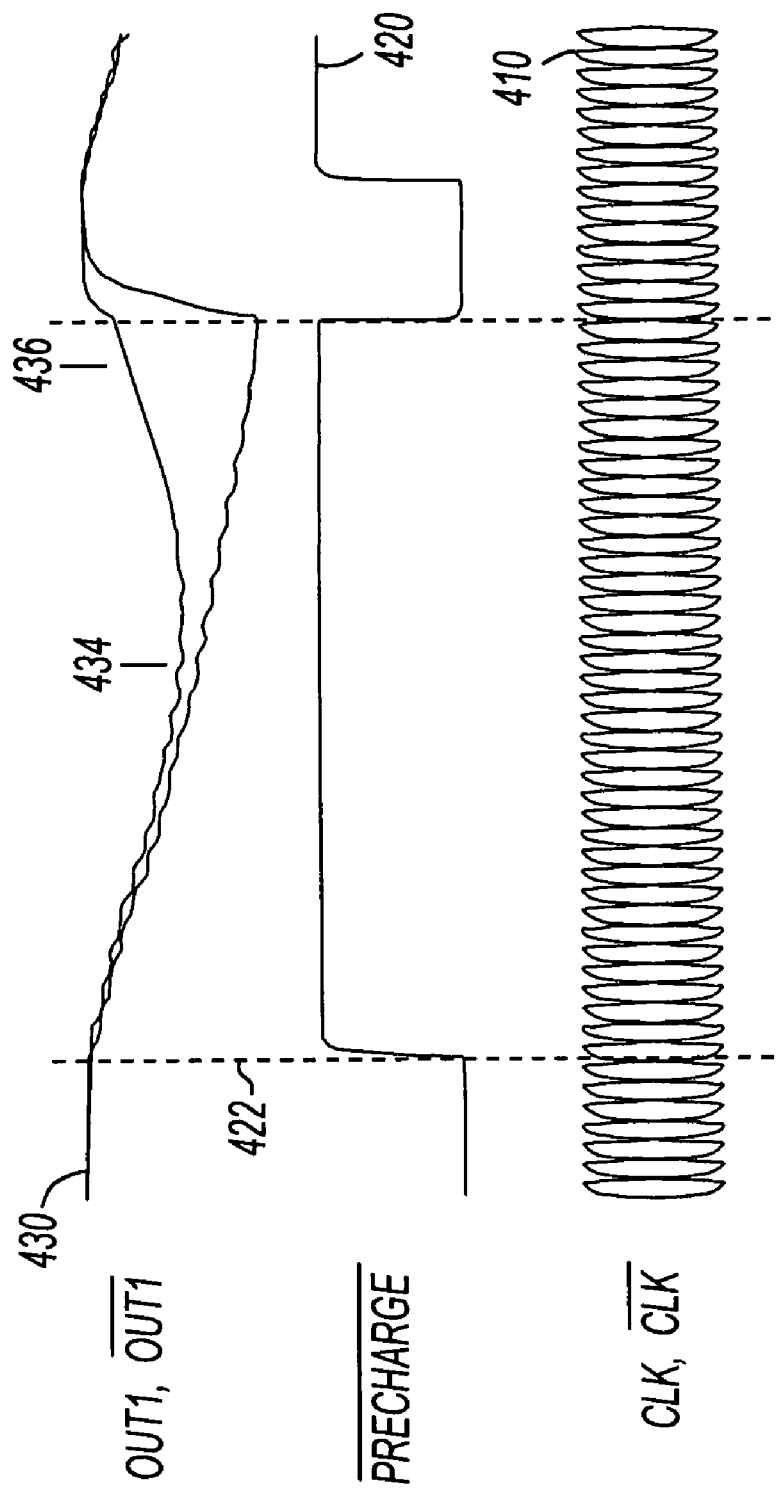
FIG. 4 shows signal waveforms describing the operation of the circuit of FIG. 2.

FIG. 4 shows signal waveforms describing the operation of duty cycle detection circuit 200 (FIG. 2). Waveform 410 shows the differential clock signal (CLK, $\overline{\text{CLK}}$) provided to the evaluation circuits in FIG. 2. Waveform 420 shows the $\overline{\text{PRECHARGE}}$ signal which transitions circuit 200 between the pre-charge phase and evaluation phase. As shown in FIG. 4, the period of $\overline{\text{PRECHARGE}}$ is substantially longer than the period of the differential clock signal, although this is not a limitation of the present invention. The $\overline{\text{PRECHARGE}}$ signal may have any relationship with the differential clock signal. Waveform 430 shows the operation of an evaluation phase of circuit 200. When $\overline{\text{PRECHARGE}}$ transitions high at time 422, circuit 200 transitions from a pre-charge phase to an evaluation phase. The waveforms shown at 430, representing the voltage on nodes 231 and 241 begin to drop in value as the evaluation transistors turn on and off with the differential clock signal. Some ripple is shown on waveform 430, which is related to the frequency of the differential clock signal.

As shown in waveforms 430, one of the two capacitors discharges slightly faster than the other based on the duty cycle error. At 434, one of transistors 202 or 212 begins to turn on, the positive feedback effect of the cross-coupled transistor begins, and one output node approaches the positive supply voltage as the other output node continues to drop in voltage. The difference in voltages on the output nodes as shown at 436 is latched by the R-S latch shown in FIG. 3.

As can be seen from FIGS. 2 through 4, duty cycle detection circuit 200 integrates a duty cycle error using analog means (capacitors 230 and 240), and provides a digital output value to signify whether the duty cycle is above or below 50%.

Figure 5:
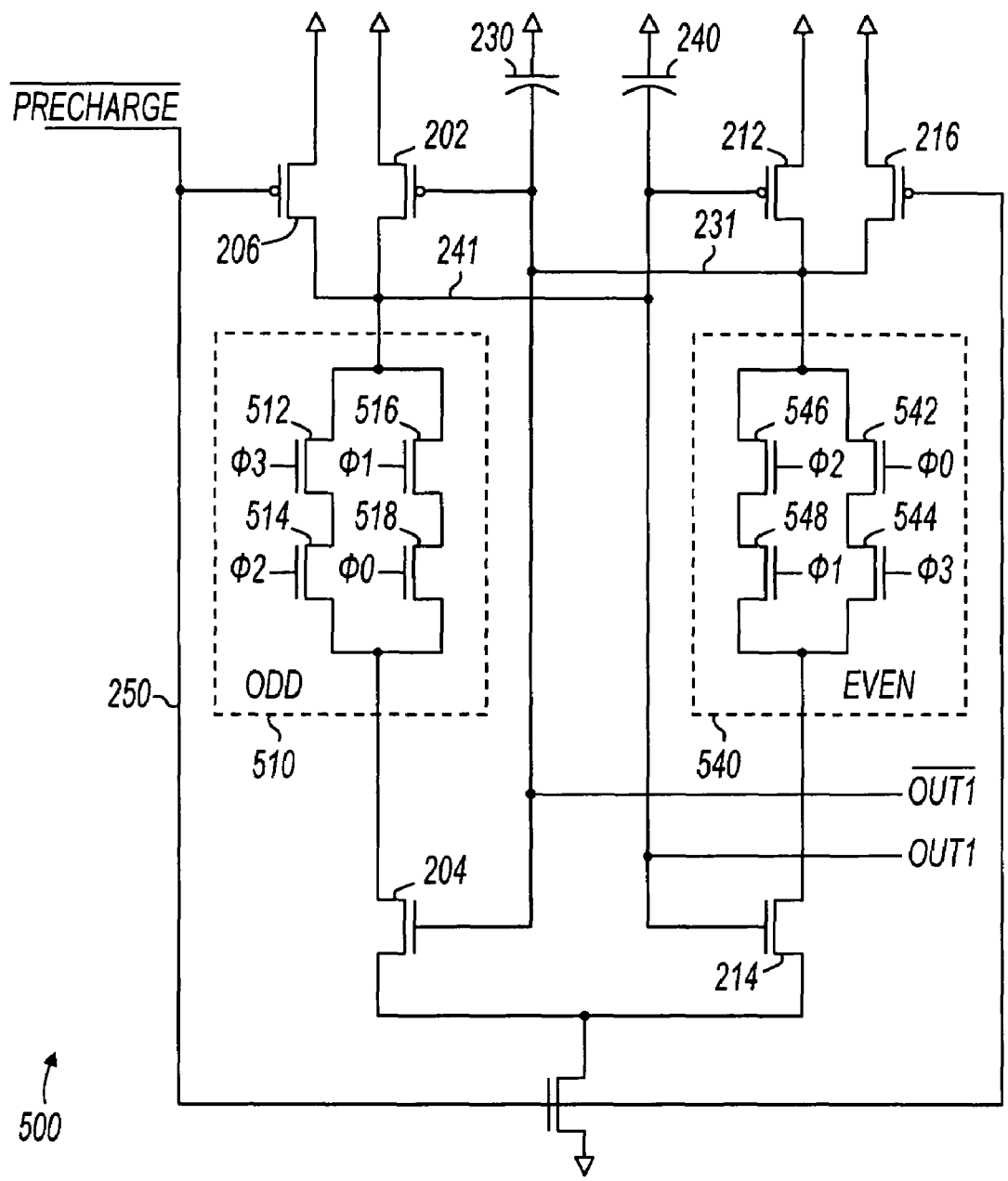
FIG. 5 shows a quadrature phase detection circuit in accordance with various embodiments of the present invention.

FIG. 5 shows a quadrature phase detector circuit. Quadrature phase detector circuit 500 is similar in many respects to duty cycle detection circuit 200 (FIG. 2). For example, circuit 500 includes capacitors 230 and 240, cross-coupled inverters formed by transistors 202, 204, 212, and 214, and a pre-charge circuit formed by transistors 206, 216, and 220. Circuit 500 also includes two evaluation circuits 510 and 540. Evaluation circuit 510 includes transistors 512, 514, 516, and 518, and evaluation circuit 540 includes transistors 542, 544, 546, and 548.

In operation, circuit 500 pre-charges capacitors 230 and 240 in the same manner as duty cycle detection circuit 200 (FIG. 2). During an evaluation phase, when a current path exists through evaluation circuit 510, the voltage on node 241 is reduced. Likewise, when a current path exists through evaluation circuit 540, the voltage on node 231 is reduced. By arranging the transistors within the evaluation circuit as shown, and driving the transistors within the evaluation circuits with quadrature clock phases as shown, quadrature phase detector circuit 500 may detect a phase error in a quadrature phase clock.

Evaluation circuit 510 is labeled "odd," and evaluation circuit 540 is labeled "even" to differentiate between periods of different overlapping clock phases. For example, odd periods exist when both clock phases $\Phi 0$ and $\Phi 1$ are high, and when both clock phases $\Phi 2$ and $\Phi 3$ are high. Likewise, even periods exist when both clock phases $\Phi 0$ and $\Phi 3$ are high, and when both clock phases $\Phi 1$ and $\Phi 2$ are high. During odd periods, evaluation circuit 510 conducts current, and during even periods, evaluation circuit 540 conducts current.

Figure 6:
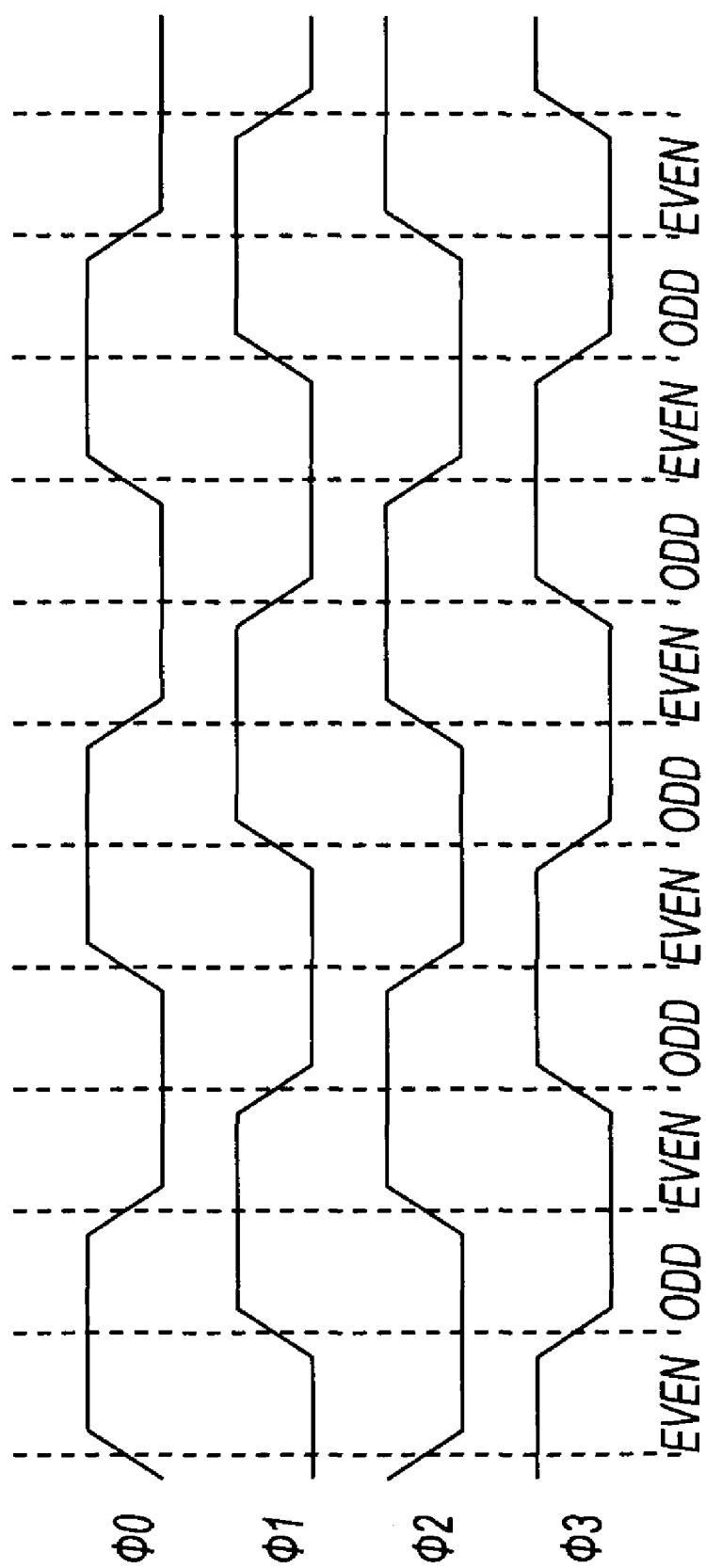
FIG. 6 shows a quadrature phase clock signal.

FIG. 6 shows waveforms of a quadrature phase clock capable of driving quadrature phase detector circuit 500 (FIG. 5). As shown in FIG. 6, the four clock phases are offset by substantially 90°. Also, $\Phi 0$ and $\Phi 2$ are complements of each other and $\Phi 1$ and $\Phi 3$ are complements of each other. Accordingly, there is a single degree of freedom, in that the phase of clock Φ1 may be changed relative to the phase of Φ0, and this will at the same time modify the clock phase of Φ3 with respect to Φ2.

The various quadrants in FIG. 6 are labeled as "even" and "odd." Referring now back to FIG. 5, evaluation circuit 510 conducts current during the odd quadrants, and evaluation circuit 540 conducts current during the even quadrants.

Similar to duty cycle detection circuit 200 (FIG. 2), quadrature phase detection circuit 500 will settle out with the cross-coupled inverters having opposite polarity output signals to signify whether the clock phase should be modified in a first polarity, or in an opposite polarity. Further, the output of quadrature phase detector 500 may be latched with an R-S latch as shown in FIG. 3.

Figure 7:
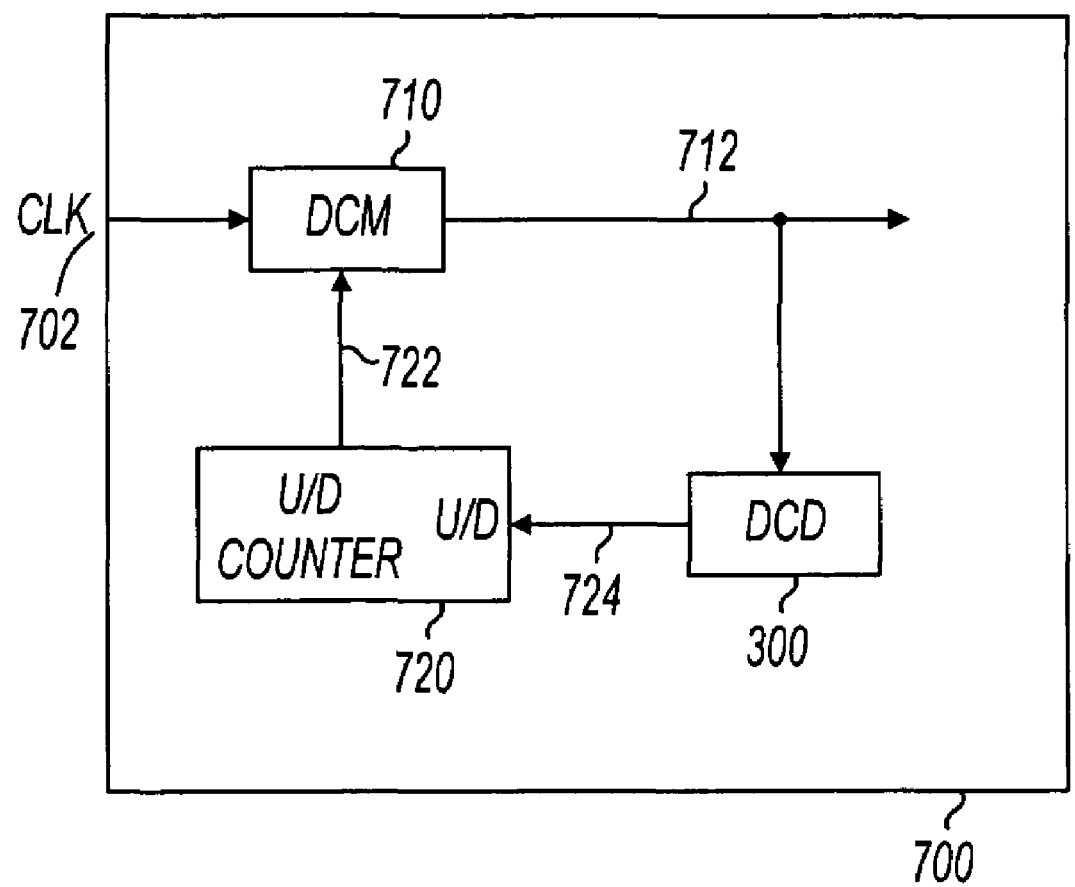
FIG. 7 shows an integrated circuit in accordance with various embodiments of the present invention.

FIG. 7 shows an integrated circuit in accordance with various embodiments of the present invention. Integrated circuit 700 includes duty cycle modification (DCM) circuit 710, duty cycle detection (DCD) circuit 300, and up-down counter 720. In operation, integrated circuit 700 receives a clock signal on node 702. The clock signal is provided to duty cycle modification circuit 710. Duty cycle modification circuit 710 may alter the duty cycle of the incoming clock signal in response to a digital signal provided by up-down counter 720. For example, duty cycle modification circuit 710 may include multiple differential pairs of transistors controlled in part by the digital signal from up-down counter to mix signals of different phases to arrive at an output clock signal having a controllable duty cycle.

Duty cycle detection circuit 300 is described above with reference to FIGS. 2 and 3. Duty cycle detection circuit 300 detects duty cycle errors on the clock signal on node 712 and provides a digital signal to up-down counter 720 on node 724. The digital signal output from duty cycle detection circuit 300 signifies whether the duty cycle should be increased or decreased. Up-down counter 720, in response to information received from duty cycle detection circuit 300, counts up or down to modify a digital word provided to duty cycle modification circuit 710 on node 722.

As shown in FIG. 7, a control loop is formed by the combination of duty cycle modification circuit 710, duty cycle detection circuit 300, and up-down counter 720. If power is removed from duty cycle modification circuit 710 and/or duty cycle detection circuit 300, up-down counter 720 may retain the duty cycle error information as provided to duty cycle modification circuit 710 on node 722. When power is reapplied, duty cycle modification circuit 710 may immediately recover and produce a clock on node 712 that incorporates the duty cycle error information retained by up-down counter 720.

Integrated circuit 700 may also include a quadrature phase detection circuit such as quadrature phase detection circuit 500 (FIG. 5). This may be in addition to, or in lieu of, duty cycle detection circuit 300. For example, an integrated circuit may operate with quadrature clock signals, and a control loop may be formed similar to that shown in FIG. 7 to control the phase of the quadrature clock signals.

Figure 8:
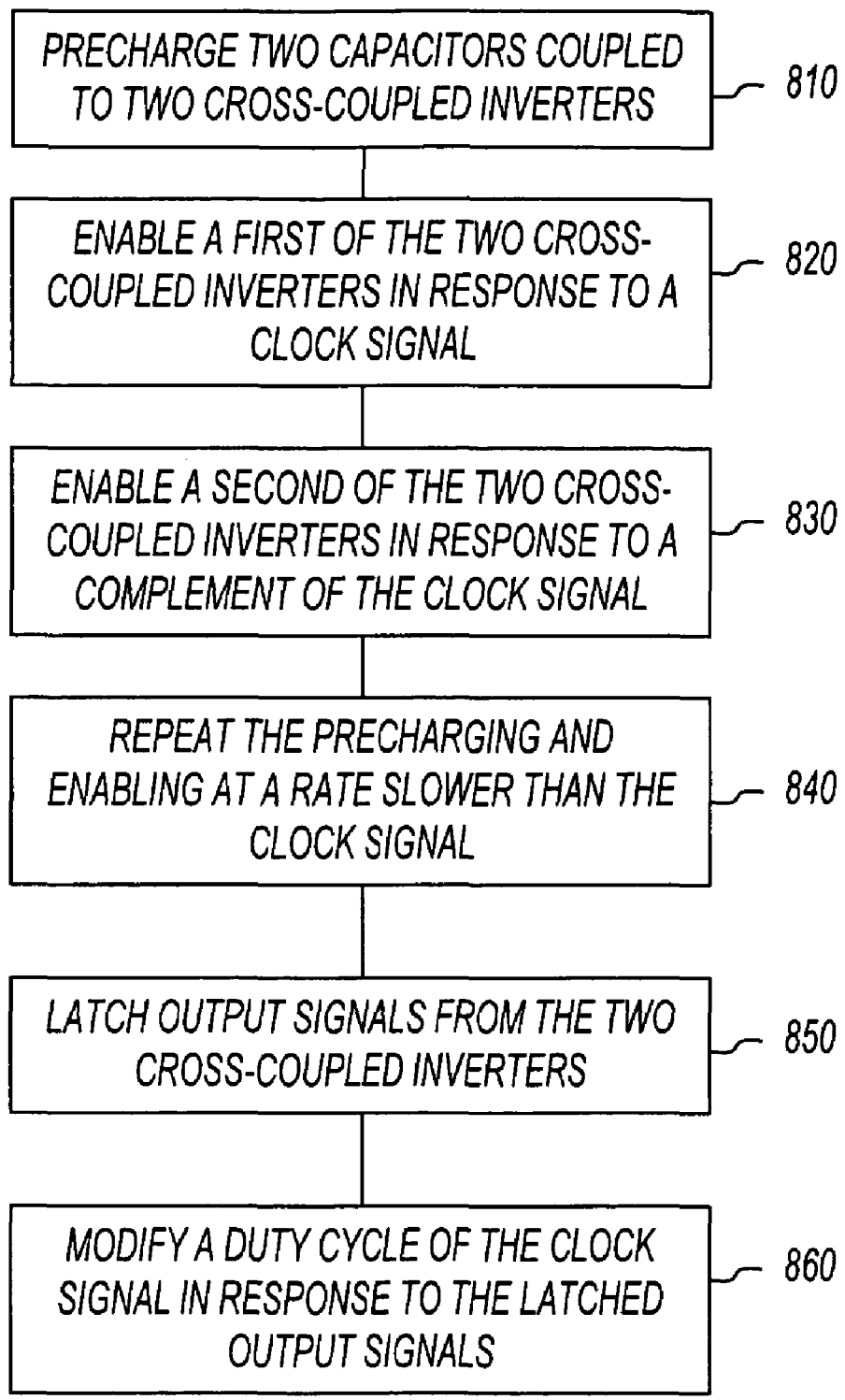
FIG. 8 shows a flowchart in accordance with various embodiments of the present invention.

FIG. 8 shows a flowchart in accordance with various embodiments of the present invention. In some embodiments, method 800 may be used to perform duty cycle detection/correction and/or quadrature phase detection/correction. In some embodiments, method 800, or portions thereof, is performed by a clock error detection circuit in an integrated circuit, embodiments of which are shown in the various figures. In other embodiments, method 800 is performed by a controller or memory device. Method 800 is not limited by the particular type of apparatus performing the method. The various actions in method 800 may be performed in the order presented, or may be performed in a different order. Further, in some embodiments, some actions listed in FIG. 8 are omitted from method 800.

Method 800 begins at 810 in which two capacitors coupled to two cross-coupled inverters are pre-charged. In some embodiments, this corresponds to the pre-charge circuits described with reference to FIGS. 2 and 5 pre-charging capacitors 230 and 240. At 820, a first of the two cross-coupled inverters is enabled in response to a clock signal, and at 830, a second of the two cross-coupled inverters is enabled in response to a complement of the clock signal. The actions at 820 and 830 correspond to evaluation circuits being alternately enabled during an evaluation phase. For example, the evaluation circuit formed by transistor 208 enables an inverter formed by transistors 202 and 204 when the clock signal is high. Also for example, the evaluation circuit formed by transistor 218 enables the inverter formed by transistors 212 and 214 when the clock signal is low.

At 840, the pre-charging and enabling is repeated at a rate slower than the clock signal. Referring now back to FIG. 4, the pre-charging and enabling (evaluation) is shown being controlled by waveform 420. This is performed at a rate slower than the clock signal shown by waveform 410. In some embodiments, the pre-charging and enabling is performed at a rate much slower than the clock rate. For example, in some embodiments, the pre-charge and enabling may occur at a rate five times slower, ten times slower, twenty times slower, or even 100 times slower than the clock signal.

At 850, the output signals from the cross-coupled inverters are latched. This may correspond to the operation of an R-S latch, or a similar latch, to latch the output of the circuit. At 860, a duty cycle of the clock signal is modified in response to the last output signal. For example, referring now back to FIG. 7, the last output signal from duty cycle detection circuit 300 may cause up-down counter 720 to increase or decrease a digital value on node 722, which in turn causes DCM 710 to modify a duty cycle of the clock signal period.

Figure 9:
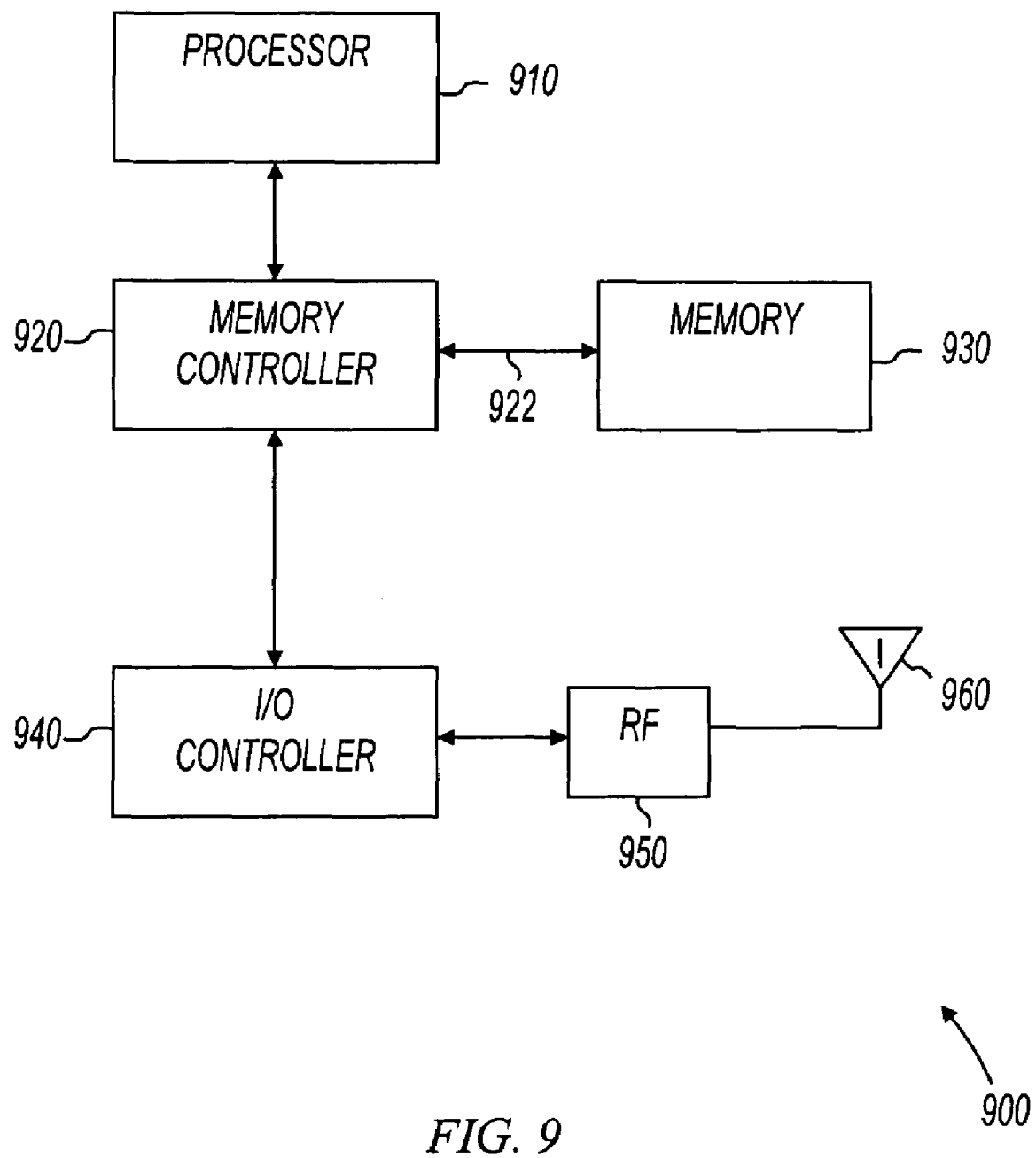
FIGS. 9 and 10 show diagrams of electronic systems in accordance with various embodiments of the present invention.

FIG. 9 shows an electronic system in accordance with various embodiments of the present invention. Electronic system 900 includes processor 910, memory controller 920, memory 930, input/output (I/O) controller 940, radio frequency (RF) circuits 950, and antenna 960. In operation, system 900 sends and receives signals using antenna 960, and these signals are processed by the various elements shown in FIG. 9. Antenna 960 may be a directional antenna or an omni-directional antenna. As used herein, the term omni-directional antenna refers to any antenna having a substantially uniform pattern in at least one plane. For example, in some embodiments, antenna 960 may be an omni-directional antenna such as a dipole antenna, or a quarter wave antenna. Also for example, in some embodiments, antenna 960 may be a directional antenna such as a parabolic dish antenna, a patch antenna, or a Yagi antenna. In some embodiments, antenna 960 may include multiple physical antennas.

Radio frequency circuit 950 communicates with antenna 960 and I/O controller 940. In some embodiments, RF circuit 950 includes a physical interface (PHY) corresponding to a communications protocol. For example, RF circuit 950 may include modulators, demodulators, mixers, frequency synthesizers, low noise amplifiers, power amplifiers, and the like. In some embodiments, RF circuit 950 may include a heterodyne receiver, and in other embodiments, RF circuit 950 may include a direct conversion receiver. In some embodiments, RF circuit 950 may include multiple receivers. For example, in embodiments with multiple antennas 960, each antenna may be coupled to a corresponding receiver. In operation, RF circuit 950 receives communications signals from antenna 960, and provides analog or digital signals to I/O controller 940. Further, I/O controller 940 may provide signals to RF circuit 950, which operates on the signals and then transmits them to antenna 960.

Processor 910 may be any type of processing device. For example, processor 910 may be a microprocessor, a microcontroller, or the like. Further, processor 910 may include any number of processing cores, or may include any number of separate processors.

Memory controller 920 provides a communications path between processor 910 and other devices shown in FIG. 9. In some embodiments, memory controller 920 is part of a hub device that provides other functions as well. As shown in FIG. 9, memory controller 920 is coupled to processor 910, I/O controller 940, and memory 930.

Memory 930 may be any type of memory technology. For example, memory 930 may be random access memory (RAM), dynamic random access memory (DRAM), static random access memory (SRAM), nonvolatile memory such as FLASH memory, or any other type of memory.

Memory 930 may represent a single memory device or a number of memory devices on one or more memory modules. Memory controller 920 provides data through bus 922 to memory 930 and receives data from memory 930 in response to read requests. Commands and/or addresses may be provided to memory 930 through conductors other than bus 922 or through bus 922. Memory controller 920 may receive data to be stored in memory 930 from processor 910 or from another source. Memory controller 920 may provide the data it receives from memory 930 to processor 910 or to another destination. Bus 922 may be a bi-directional bus or unidirectional bus. Bus 922 may include many parallel conductors. The signals may be differential or single ended. In some embodiments, bus 922 operates using a forwarded, multi-phase clock scheme.

Memory controller 920 is also coupled to I/O controller 940, and provides a communications path between processor 910 and I/O controller 940. I/O controller 940 includes circuitry for communicating with I/O circuits such as serial ports, parallel ports, universal serial bus (USB) ports, and the like. As shown in FIG. 9, I/O controller 940 provides a communications path to RF circuits 950.

Any of the integrated circuits shown in FIG. 9 may include clock error detection circuit embodiments of the present invention. For example, processor 910, memory controller 920, I/O controller 940, or memory 930 may include any of the clock error detection circuit embodiments described herein. For example, memory device 930 may include the circuitry described with reference to FIGS. 2-5. Further, memory 930 may include multiple memory devices where each of the memory devices includes the circuitry described with reference to the previous figures.

Figure 10:
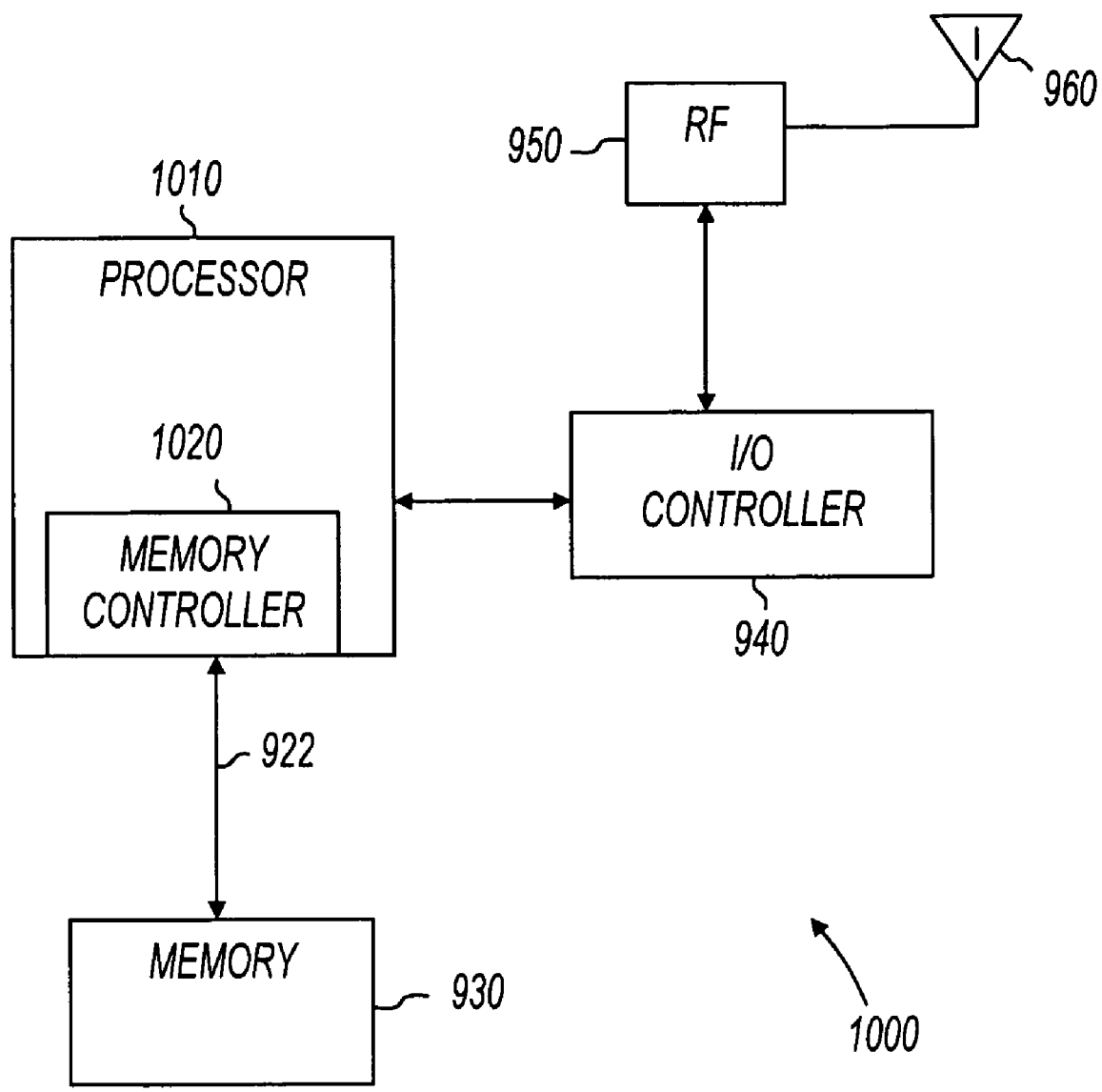

FIG. 10 shows an electronic system in accordance with various embodiments of the present invention. Electronic system 1000 includes memory 930, I/O controller 940, RF circuits 950, and antenna 960, all of which are described above with reference to FIG. 9. Electronic system 1000 also includes processor 1010 and memory controller 1020. As shown in FIG. 10, memory controller 1020 is included in processor 1010. Processor 1010 may be any type of processor as described above with reference to processor 910 (FIG. 9). Processor 1010 differs from processor 910 in that processor 1010 includes memory controller 920, whereas processor 910 does not include a memory controller.

Example systems represented by FIGS. 9 and 10 include desktop computers, laptop computers, cellular phones, personal digital assistants, wireless local area network interfaces, or any other suitable system. Many other systems uses for clock error detection circuits exist. For example, the clock error detection embodiments described herein may be used in a server computer, a network bridge or router, or any other system with or without an antenna.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A circuit comprising:
   two capacitors;
   a pre-charge circuit to pre-charge the two capacitors during a pre-charge phase;
   two cross-coupled inverters, each having an output node coupled to a different one of the two capacitors; and
   two evaluation circuits, each coupled to enable a different one of the two cross-coupled inverters during an evaluation phase.

2. The circuit of claim 1 wherein the pre-charge circuit comprises two transistors, each in parallel with a different one of the two capacitors.

3. The circuit of claim 2 further comprising a transistor coupled between both of the two cross-coupled inverters and a lower power supply node.

4. The circuit of claim 1 wherein each of the two cross-coupled inverters comprises a complementary pair of transistors, and each of the two evaluation circuits comprises a transistor coupled between the complementary pair of transistors.

5. The circuit of claim 1 wherein each of the two evaluation circuits comprises a plurality of transistors coupled to enable a corresponding one of the two cross-coupled inverters when input signals overlap in time.

6. The circuit of claim 1 further comprising a latch circuit coupled to the output nodes of the two cross-coupled inverters.

7. An integrated circuit comprising:
   a clock duty cycle modification circuit to change a duty cycle of a clock signal in response to a digital word;
   an up/down counter coupled to be responsive to an up/down signal, and coupled to provide the digital word; and
   a clock duty cycle detection circuit to receive a clock signal from the clock duty cycle modification circuit and to produce an up/down signal, the clock duty cycle detection circuit including two capacitors to integrate a duty cycle difference, and a latch to detect a voltage difference on the two capacitors and provide the up/down signal.

8. The integrated circuit of claim 7 wherein the clock duty cycle detection circuit comprises two cross-coupled inverters coupled between the two capacitors.

9. The integrated circuit of claim 8 wherein the clock duty cycle detection circuit further comprises a pre-charge circuit to pre-charge the two capacitors during an evaluation phase.

10. The integrated circuit of claim 9 wherein the clock duty cycle detection circuit further comprising enable transistors to enable the two cross-coupled inverters in response to the clock signal.

11. A method comprising:
   precharging two capacitors coupled to two cross-coupled inverters;
   enabling a first of the two cross-coupled inverters in response to a clock signal; and
   enabling a second of the two cross-coupled inverters in response to a complement of the clock signal.

12. The method of claim 11 further comprising repeating the precharging and enabling at a rate slower than the clock signal.

13. The method of claim 11 further comprising repeating the precharging and enabling at a rate at least ten times slower than the clock signal.

14. The method of claim 11 further comprising latching output signals from the two cross-coupled inverters.

15. The method of claim 14 further comprising modifying a duty cycle of the clock signal in response to the latched output signals.

16. An electronic system comprising:
   an antenna;
   a radio frequency circuit coupled to the antenna;
   a controller coupled to the radio frequency circuit; and
   a memory device coupled to the controller, the memory device including a clock duty cycle modification circuit to change a duty cycle of a clock signal in response to a digital word, an up/down counter coupled to be responsive to an up/down signal, and coupled to provide the digital word, and a clock duty cycle detection circuit to receive a clock signal from the clock duty cycle modification circuit and to produce an up/down signal, the clock duty cycle detection circuit including two capacitors to integrate a duty cycle difference, and a latch to detect a voltage difference on the two capacitors and provide the up/down signal.

17. The electronic system of claim 16 wherein the clock duty cycle detection circuit comprises two cross-coupled inverters coupled between the two capacitors.

18. The electronic system of claim 17 wherein the clock duty cycle detection circuit further comprises a pre-charge circuit to pre-charge the two capacitors during an evaluation phase.

19. The electronic system of claim 18 wherein the pre-charge circuit comprises transistors coupled in parallel with the two capacitors.

20. The electronic system of claim 18 wherein the clock duty cycle detection circuit further comprising enable transistors to enable the two cross-coupled inverters in response to the clock signal.

* * * * *